US010687158B2

(12) United States Patent
Garabedian

(10) Patent No.: US 10,687,158 B2
(45) Date of Patent: Jun. 16, 2020

(54) SYSTEMS, DEVICES, AND METHODS FOR CONVERTING ARTWORK OR PHOTOGRAPHS INTO AUDIO-ENHANCED EXHIBITS

(71) Applicant: Marcus Garabedian, Anaheim, CA (US)

(72) Inventor: Marcus Garabedian, Anaheim, CA (US)

( * ) Notice: Subject to any disclaimer, the term of this patent is extended or adjusted under 35 U.S.C. 154(b) by 0 days.

(21) Appl. No.: 16/280,793

(22) Filed: Feb. 20, 2019

(65) Prior Publication Data

US 2019/0253819 A1    Aug. 15, 2019

Related U.S. Application Data

(60) Provisional application No. 62/362,823, filed on Jul. 15, 2016.

(51) Int. Cl.
| | |
|---|---|
| *H04R 27/00* | (2006.01) |
| *H04R 3/12* | (2006.01) |
| *H04R 1/02* | (2006.01) |
| *H02J 7/00* | (2006.01) |
| *H03F 3/181* | (2006.01) |

(52) U.S. Cl.
CPC ............... *H04R 27/00* (2013.01); *H02J 7/00* (2013.01); *H04R 1/02* (2013.01); *H04R 3/12* (2013.01); *H03F 3/181* (2013.01); *H03F 2200/03* (2013.01); *H04R 2420/07* (2013.01)

(58) Field of Classification Search
CPC ...... H04R 27/00; H04R 2420/07; H04R 1/02; H04R 3/12; H02J 2007/0062; H02J 7/0052; H03F 3/181; H03F 2200/03
USPC ............................................. 381/28, 77, 124
See application file for complete search history.

(56) References Cited

U.S. PATENT DOCUMENTS

| | | | | |
|---|---|---|---|---|
| 6,739,065 | B2 * | 5/2004 | Hofmeister | A47G 1/205 33/451 |
| 7,784,762 | B2 * | 8/2010 | Klein | F16M 11/10 227/31 |
| 8,020,816 | B2 * | 9/2011 | Laitila | F16M 13/00 16/342 |
| 2015/0332615 | A1 * | 11/2015 | Sundholm | G09F 3/204 40/655 |
| 2017/0289661 | A1 * | 10/2017 | Hose | H04R 7/045 |

* cited by examiner

*Primary Examiner* — William A Jerez Lora
(74) *Attorney, Agent, or Firm* — One LLP

(57) ABSTRACT

Systems, devices and methods are provided for converting artwork or photographs into audio-enhanced exhibits. In particular, the embodiments disclosed herein can avoid the inconvenience and risk of damage associated with having to remove a panel on which a piece of artwork, photograph or print is mounted to power on/off or plug in an audio system. In some embodiments, an input module is provided on an edge perpendicular to the panel frame. A charging port and/or power switch are positioned perpendicular to the frame so that either can be accessed from a side edge of the panel.

5 Claims, 4 Drawing Sheets

SYSTEMS, DEVICES, AND METHODS FOR CONVERTING ARTWORK OR PHOTOGRAPHS INTO AUDIO-ENHANCED EXHIBITS

CROSS-REFERENCE TO RELATED APPLICATIONS

This application claims the benefit of and priority to U.S. Provisional Patent Application Ser. No. 62/632,823, filed Feb. 20, 2018, which is incorporated by reference herein in its entirety and for all purposes.

FIELD

The subject matter described herein relates generally to systems, devices, and methods for converting artwork or photographs into audio-enhanced exhibits.

BACKGROUND

Canvas stretched artwork or photographic prints can be augmented with audio capabilities. However, current systems have power switches and charging mechanisms that are difficult to access (e.g., positioned on the rear of the panel), and usually require the artwork or print to be removed so that the user can reach behind the panel to power on/off, or plug a charging cable into a port to charge/power the system. Additionally, many known audio components, such as receivers or speaker components, can be bulky and not configured for optimal use with visual exhibits, particularly those to be displayed on a flat wall surface.

For these and other reasons, needs exist for methods, systems and devices for converting artwork or photographs into audio-enhanced exhibits.

SUMMARY

Provided herein are example embodiments of systems, devices and methods for converting artwork or photographs into audio-enhanced exhibits. According to one embodiment, a system comprising a panel for holding artwork or a photograph is mounted to a front side of the panel. One or more exciters may be mounted to a rear side of the panel for playing audio to accompany the artwork or photograph. According to another aspect of the embodiments, a wireless receiver may be mounted to the panel and connected to the one or more exciters, wherein the wireless receiver is adapted to transmit an audio signal to the one more exciters. A power source and amplifier may be mounted to the panel and connected to the wireless receiver and exciter. In addition, an input module is coupled perpendicular to an edge of the panel. The input module includes a charging port and/or a power switch accessible from a surface perpendicular to the panel. The charging port and/or the power switch are wired in connection to the power source to provide easy access to powering the system (or powering off the system) without having to remove the panel from its mount to a wall.

According to another embodiment, a system may include a low-profile housing include an access portion, a cut-out portion, and a component portion, wherein the low-profile housing is configured to be affixed to an artwork or photograph with or without a panel.

Other systems, devices, methods, features and advantages of the subject matter described herein will be or will become apparent to one with skill in the art upon examination of the following figures and detailed description. It is intended that all such additional systems, devices, methods, features and advantages be included within this description, be within the scope of the subject matter described herein, and be protected by the accompanying claims. In no way should the features of the example embodiments be construed as limiting the appended claims, absent express recitation of those features in the claims.

BRIEF DESCRIPTION OF THE FIGURES

The details of the subject matter set forth herein, both as to its structure and operation, may be apparent by study of the accompanying figures, in which like reference numerals refer to like parts. The components in the figures are not necessarily to scale, emphasis instead being placed upon illustrating the principles of the subject matter. Moreover, all illustrations are intended to convey concepts, where relative sizes, shapes and other detailed attributes may be illustrated schematically rather than literally or precisely.

DETAILED DESCRIPTION

Before the present subject matter is described in detail, it is to be understood that this disclosure is not limited to the particular embodiments described herein, as such may, of course, vary. It is also to be understood that the terminology used herein is for the purpose of describing particular embodiments only, and is not intended to be limiting, since the scope of the present disclosure will be limited only by the appended claims.

As used herein and in the appended claims, the singular forms "a," "an," and "the" include plural referents unless the context clearly dictates otherwise.

Generally, embodiments of the subject technology provide an audio system onto which artwork such as stretched canvas or photographic prints may be mounted and enhanced with audio capabilities to provide for example, a musical or narrative accompaniment.

Figure 1:
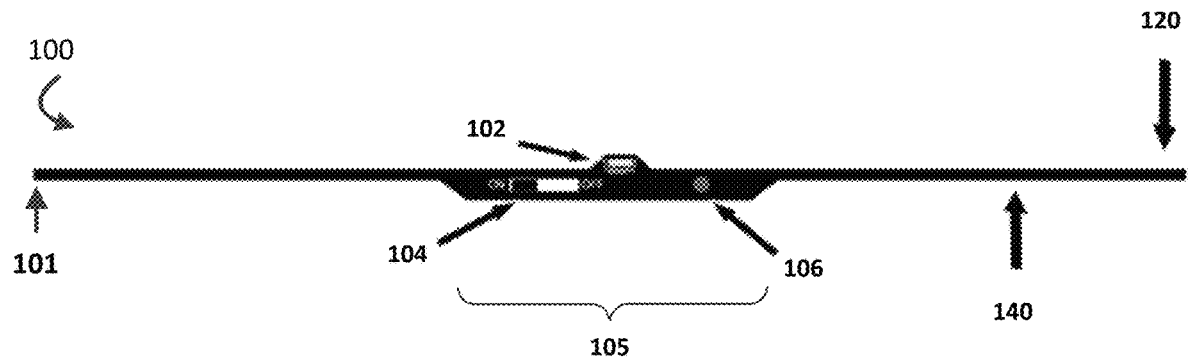
FIG. 1 is a bottom view of an example embodiment of an audio panel system for artwork or photographs.
Figure 2:
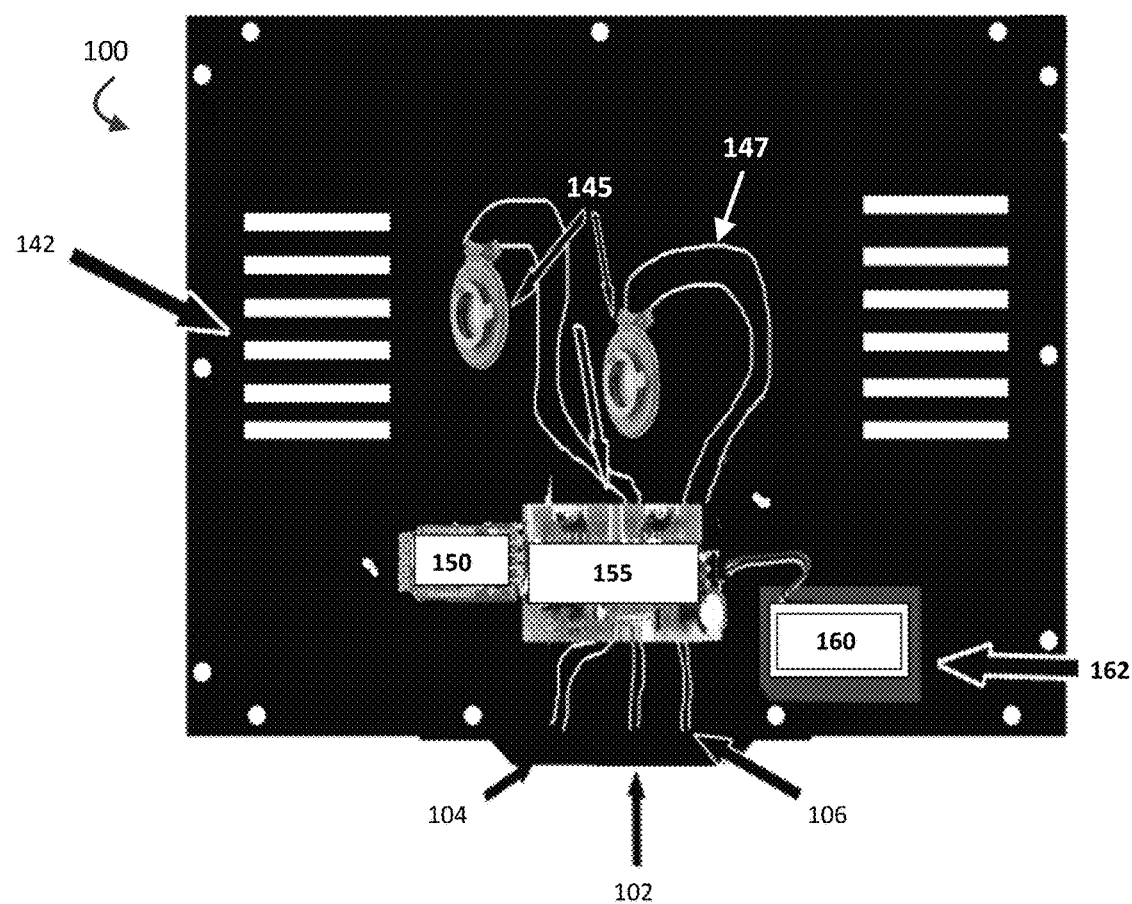
FIG. 2 is a rear view of an example embodiment of the audio panel system of FIG. 1.
Figure 3:
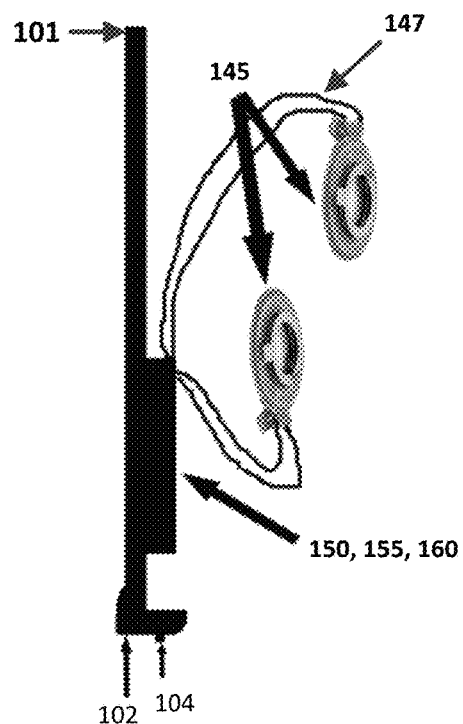
FIG. 3 is a side view of an example embodiment of an assembly for an audio panel system for artwork or photographs.
Figure 4:
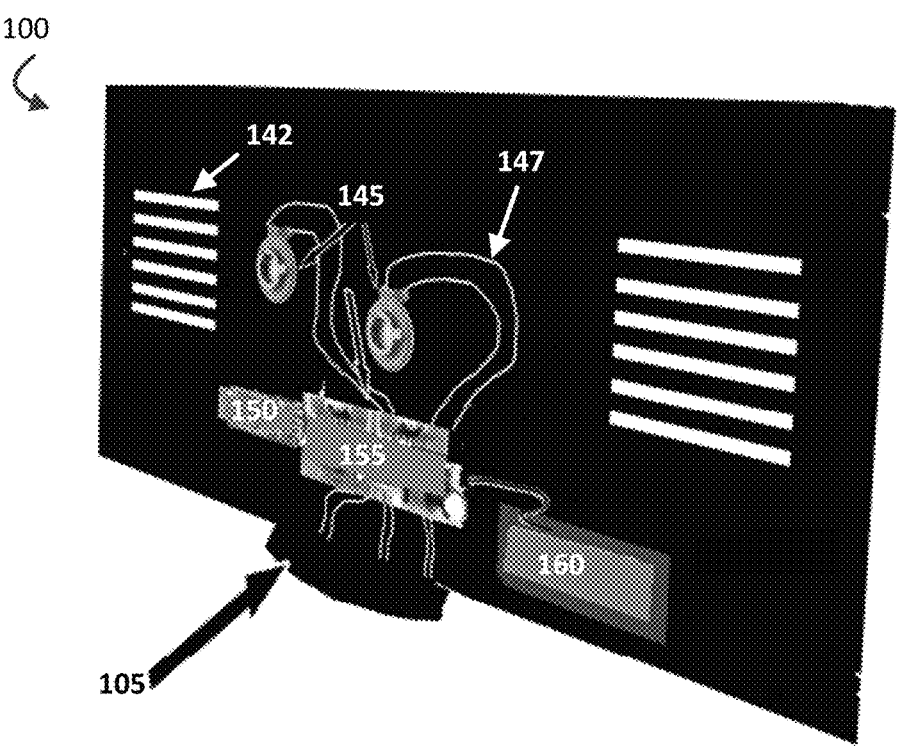
FIG. 4 is a perspective view of an example embodiment of an audio panel system.

Referring to FIGS. 1-4, an example embodiment of an audio panel system 100 is shown that solves many of the problems related to conventional audio panel systems, such as difficulties with powering on/off the system and/or charging the system. FIGS. 1, 2 and 4 are, respectively, a bottom view, a rear view and a perspective view of an example embodiment of audio panel system 100. FIG. 3 is a side view of an example embodiment of an assembly to be used with audio panel system 100.

According to one aspect of the embodiments, and as best seen in FIG. 1, audio panel system 100 can include a panel 101 having a back side 120 and a component side 140. Panel 101 can comprise a matte board, a cardboard-like material, an ABS plastic, or any like material. In many embodiments, for example, audio panel system 100 can include an input module 105 positioned to project in a perpendicular fashion from an edge of panel 101. Input module 105 can include charging port 102, configured to receive power when attached to a charging cable, and power switch 104 on or proximate to a bottom surface of input module 105, so that each can be accessed easily from the back side 120 of panel 101 to which artwork, a photograph or a print is mounted onto, without disturbing the art, photograph or print. In some embodiments, input module 105 can also include an LED indicator 106 configured to illuminate when the power is switched on. In some embodiments, charging port 102 can also be configured as a data communication port for wired data communication with external devices, such as a desktop or laptop computer, smart phone or tablet computer. Example data communication ports can include, for example, USB ports, mini USB ports, USB Type-C ports, USB micro-A and/or micro-B ports, RS-232 ports, Ethernet ports, Firewire ports, or other similar data communication ports configured to connect to the compatible data cables.

Charging port 102, power switch 104 and LED indicator can each be electrically coupled to a power source 160, one or more amplifiers 155, and one or more exciters 145. As seen in FIG. 2, power source 160 can include one or more batteries, which can be rechargeable or single-use disposable batteries, and which can be housed in a battery compartment having a battery compartment door 162 that is secured by one or more screws. Power source 160 can include or be coupled to power management circuitry, which can regulate battery charging and power supply monitoring, boost power, perform DC conversions, and the like.

According to one aspect of the embodiments, with the ability to recharge the power source 160 using the charging port 102, the rechargeable battery can be configured to last for several years, thus requiring the user to change the battery infrequently.

Figure 7:
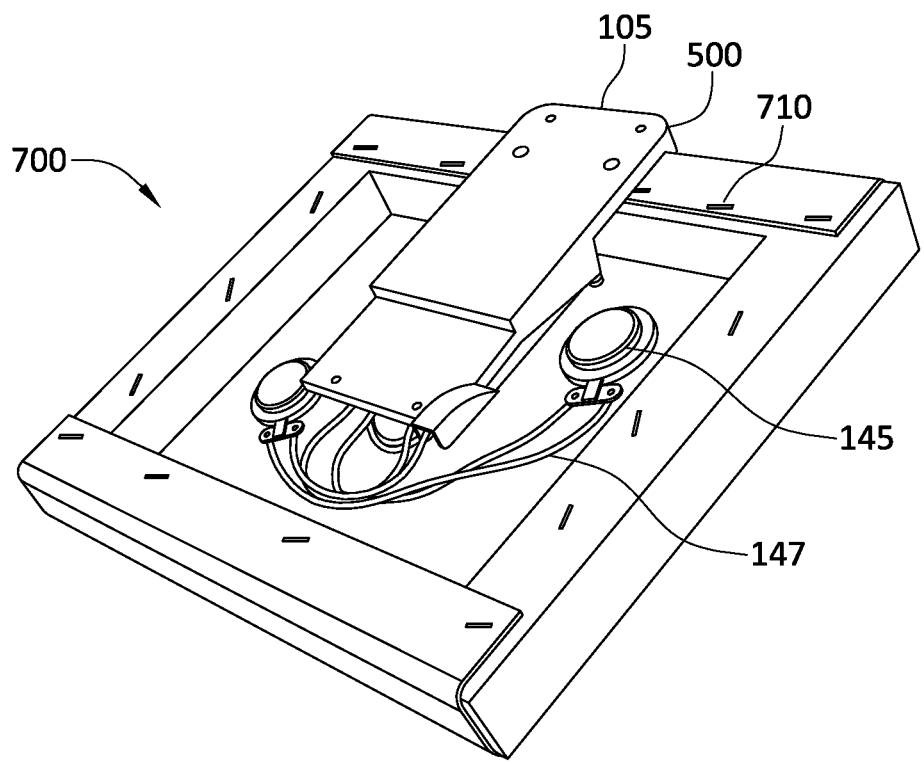
FIG. 7 is a photograph depicting a rear perspective view of an example embodiment of an audio-enhanced exhibit for artwork or photographs.

According to another aspect of the embodiments, one or more exciters 145, which can be electrically coupled to the one or more amplifiers 155 via one or more leads 147, can operate to produce an audio output to accompany the artwork or photographic print. FIG. 3, for example, depicts exciters 145 in a detached state from panel 101, illustrating that exciters 145 can be positioned in any location desired on panel 101. In some embodiments, exciters 145 can be affixed to panel 101 by an adhesive, such as a silicon adhesive. In other embodiments, exciters 145 can be affixed to the back of the canvas of the artwork, photograph, or print, as shown in FIG. 7. Furthermore, although two exciters 145 are depicted, those of skill in the art will appreciate that any number of exciters 145 (e.g., 1, 3, 4, 5, etc.) can be implemented. Some embodiments may include wireless receiver 150 (for example, a Bluetooth module) to receive wireless audio signals from an external device so that panel system 100 may be re-programmed for different audio files on demand. Some embodiments may also include an intermediate material such as foam, plastic or another resonant medium to transmit the audio waves from the exciter(s) 145 out from panel system 100. Other embodiments may include vents 142 to help the audio into the surrounding environment. In still other embodiments, panel system 100 may not include vents, particularly where no panel 101 is utilized, such as with the embodiment described with respect to FIG. 7.

According to another aspect of the embodiments, in use, the electrical components including the exciter(s) 145, amplifier 155, power source 160, wiring 147, and wireless receiver 150 can be generally positioned on the component side 140 of panel 101, and the artwork or photographic print is on the back side 120 of panel 101. While charging port 102 and power switch 104 may be positioned on any edge perpendicular to the panel frame, an example embodiment may position the charging port 102 and power switch 104 on a bottom edge to provide convenient access to one trying to plug panel system 100 into, for example, a walled electrical outlet (not shown) or to flip power switch 104. As will be appreciated by those of skill in the art, powering the audio panel system 100 on and off may now be accomplished without having to move the panel 101 away from the wall, which minimizes the risk of damage to the art, photo or print mounted thereon.

Figure 6:
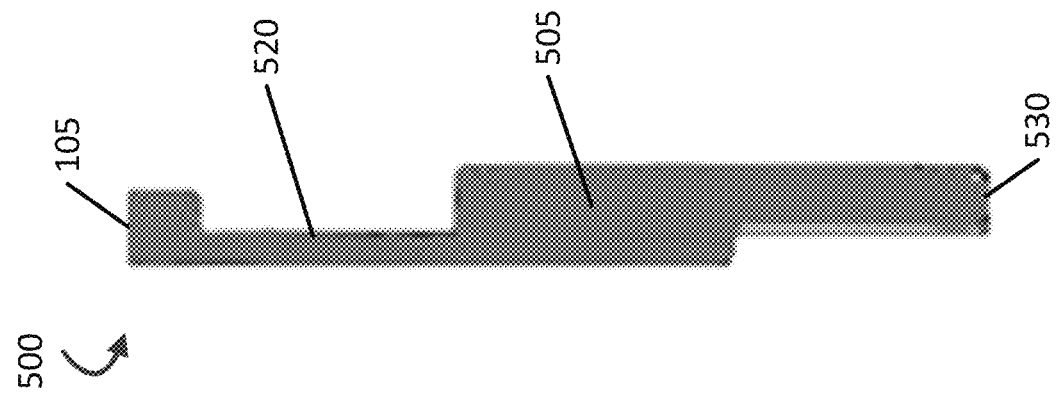
FIG. 6 is a side view of an example embodiment of an assembly to be used with artwork or photographs in an audio-enhanced exhibit.
Figure 5:
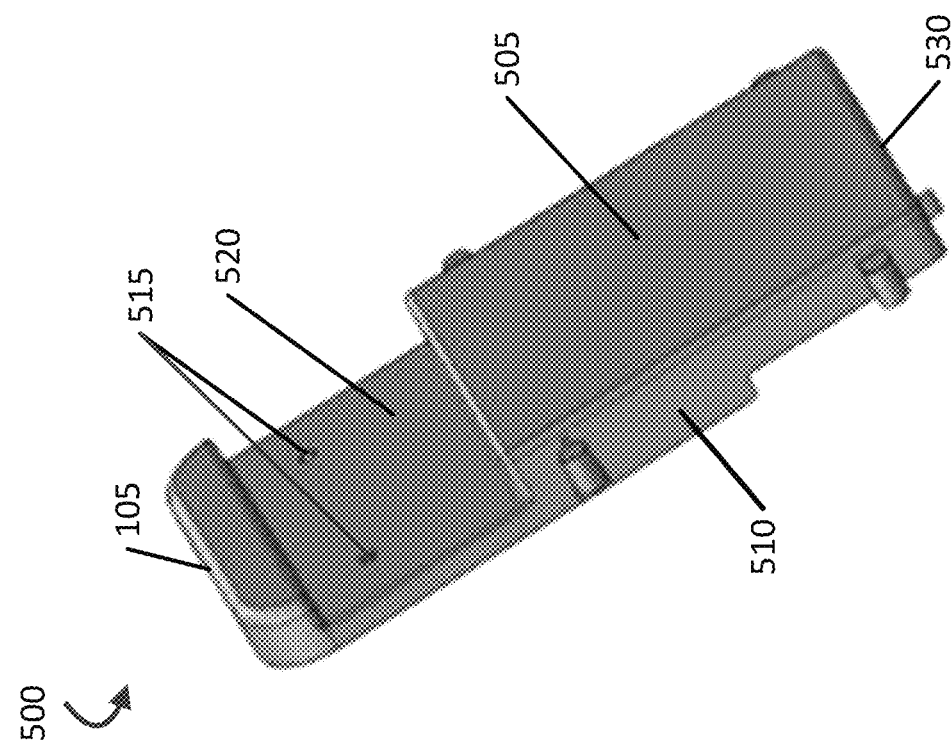
FIG. 5 is a perspective view of an example embodiment of an assembly to be used with artwork or photographs in an audio-enhanced exhibit.

Referring next to FIGS. 5 and 6, a perspective view and a side view, respectively, are provided of an example embodiment of an assembly 500 for an audio-enhanced exhibit for artwork or photographs. According to one aspect of the embodiments, assembly 500 can comprise a low-profile housing 510, including a component portion 505 of housing 510 to house, at least, the wireless receiver, amplifier, and power source. In many embodiments, housing 510 of assembly 500 can also include a cut-out portion 520, wherein cut-out portion 520 has a thickness that is less than the component portion 505 of housing 510, and wherein cut-out portion 520 is adapted to receive at least a portion of a frame or stretcher bar of the artwork, photograph or print. In some embodiments, housing 510 can also include one or more apertures 515 configured to receive an attachment element (e.g., screw, tack, nail, etc.) to affix the housing to the frame or stretcher bar of the artwork, photograph or print.

Referring still to FIGS. 5 and 6, assembly 500 can also include an access portion 105 of housing 510 that is adjacent to cut-out portion 520, wherein access portion 105 can comprise the charging port, power switch and LED light (not shown). In some embodiments, component portion 505 can include one or more openings 530 through which one or more leads (or pairs of leads) can pass through to connect with one or more exciters (not shown).

Figure 8:
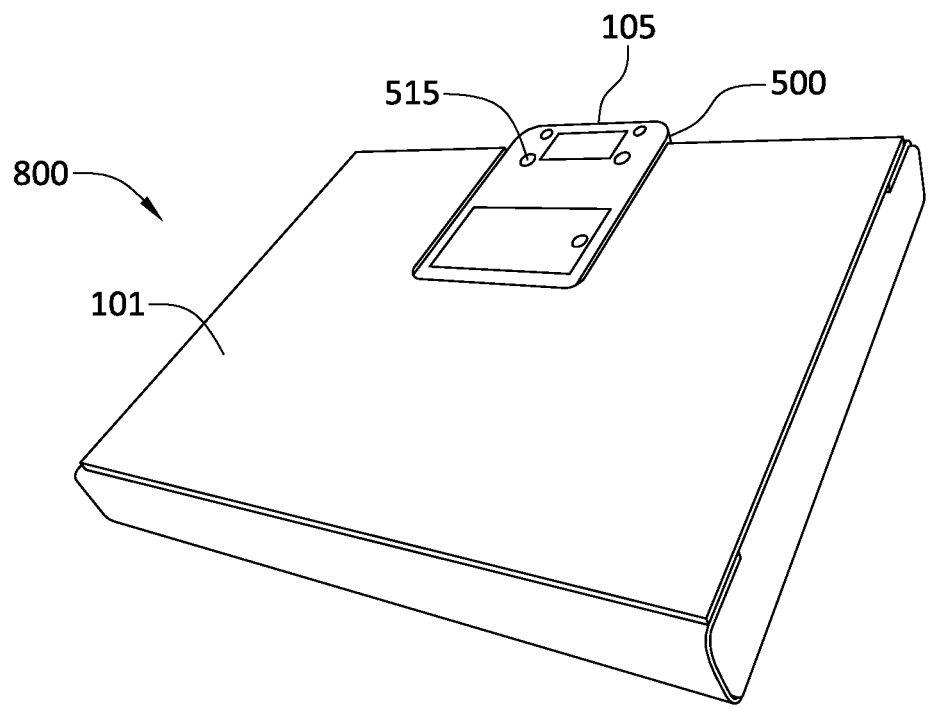
FIG. 8 is another photograph depicting a rear perspective view of an example embodiment of an audio-enhanced exhibit for artwork or photographs.

FIGS. 7 and 8 are rear perspective views of example embodiments of audio-enhanced exhibits 700, 800 for artwork, photographs, and/or prints. Referring first to FIG. 7, audio-enhanced exhibit 700 includes an assembly 500, such as the embodiment described with respect to FIGS. 5 and 6. As shown in FIG. 7, in some embodiments, audio-enhanced exhibit 700 does not include a panel, and assembly 500 is affixed directly to the frame or stretcher bar 710 of the artwork, photograph, or print. Similarly, in some embodiments, one or more exciters 145 can be affixed to the back of the canvas of the artwork, photograph, or print, using an adhesive. The one or more exciters 145 can include one or more leads 147, which are coupled to the receiver electronics housed in assembly 500. Input module 105 (e.g., charging port, power switch, LED indicator) is shown at the top of assembly 500.

FIG. 8 is a rear perspective view of another audio-enhanced exhibit 800, which can include a panel 101. As can be seen in FIG. 8, for a more aesthetically pleasing look, panel 101 can hide the exciters, leads, and part of assembly 500. In this embodiment, assembly 500 can be affixed to the frame or stretcher bar of the artwork, photograph, or print, through panel 101, wherein panel 101 and assembly 500 are affixed in place through one or more attachment elements (e.g., screws, tacks, nails, etc.) passing through apertures 515 of assembly 500. Input module 105 (e.g., charging port, power switch, LED indicator) is shown at the top of assembly 500. According to one aspect of the embodiments, as best seen in FIG. 8, assembly 500 is adapted such that, when installed with the artwork, photograph or print, assembly 500 can be flush (or nearly flush) with a wall surface to which exhibit 800 is mounted, while maintaining access to input module 105 on a perpendicular edge of exhibit 800.

It should also be noted that all features, elements, components, functions, and steps described with respect to any of the embodiments provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and steps from different embodiments, or that substitute features, elements, components, functions, and steps from one embodiment with those of another, even if the following description does not explicitly state, in a particular instance, that such combinations or substitutions are possible. It is explicitly acknowledged that express recitation of every possible combination and substitution is overly burdensome, especially given that the permissibility of each and every such combination and substitution will be readily recognized by those of ordinary skill in the art.

To the extent the embodiments disclosed herein include or operate in association with memory, storage, and/or computer readable media, then that memory, storage, and/or computer readable media are non-transitory. Accordingly, to the extent that memory, storage, and/or computer readable media are covered by one or more claims, then that memory, storage, and/or computer readable media is only non-transitory.

While the embodiments are susceptible to various modifications and alternative forms, specific examples thereof have been shown in the drawings and are herein described in detail. It should be understood, however, that these embodiments are not to be limited to the particular form disclosed, but to the contrary, these embodiments are to cover all modifications, equivalents, and alternatives falling within the spirit of the disclosure. Furthermore, any features, functions, steps, or elements of the embodiments may be recited in or added to the claims, as well as negative limitations that define the inventive scope of the claims by features, functions, steps, or elements that are not within that scope.

What is claimed is:

1. An assembly for an audio-enhanced exhibit, the assembly comprising:
    a low-profile housing comprising:
        a component portion configured to house a wireless receiver, an amplifier, and a power source;
        a cut-out portion configured to receive at least a portion of a frame or a stretcher bar of an artwork, a photograph, or a print;
        one or more apertures configured to receive one or more attachment elements, wherein the one or more attachment elements are configured to affix the low-profile housing to the frame or the stretcher bar of the artwork, the photograph, or the print.

2. The assembly of claim 1, wherein the cut-out portion has a thickness less than a thickness of the component portion.

3. The assembly of claim 1, wherein the one or more attachment elements comprise at least one of a screw, tack, or nail.

4. The assembly of claim 1, wherein the low-profile housing further comprises an access portion adjacent to the cut-out portion, wherein the access portion comprises a charging port, a power switch, and an LED light.

5. The assembly of claim 1, further comprising one or more exciters configured to be affixed to a back side of an artwork, a photograph, or a print.

* * * * *

UNITED STATES PATENT AND TRADEMARK OFFICE
CERTIFICATE OF CORRECTION

PATENT NO. : 10,687,158 B2  
APPLICATION NO. : 16/280793  
DATED : June 16, 2020  
INVENTOR(S) : Marcus Garabedian Page 1 of 1

It is certified that error appears in the above-identified patent and that said Letters Patent is hereby corrected as shown below:

On the Title Page

Under Related U.S. Application Data, item (60), "Provisional application No. 62/362,823" should be replaced with "Provisional application No. 62/632,823".

Signed and Sealed this  
Fifteenth Day of February, 2022

Drew Hirshfeld  
*Performing the Functions and Duties of the*  
*Under Secretary of Commerce for Intellectual Property and*  
*Director of the United States Patent and Trademark Office*